US012634605B2

(12) United States Patent
Gurindagunta

(10) Patent No.: US 12,634,605 B2
(45) Date of Patent: May 19, 2026

(54) HIGH-SPEED IMAGER CIRCUIT

(71) Applicant: SEMICONDUCTOR COMPONENTS INDUSTRIES, LLC, Scottsdale, AZ (US)

(72) Inventor: Sundaraiah Gurindagunta, Gollapudi (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 212 days.

(21) Appl. No.: 18/396,456

(22) Filed: Dec. 26, 2023

(65) Prior Publication Data

US 2025/0211876 A1      Jun. 26, 2025

(51) Int. Cl.
| | |
|---|---|
| *H04N 25/78* | (2023.01) |
| *H03M 1/38* | (2006.01) |
| *H04N 25/709* | (2023.01) |
| *H04N 25/771* | (2023.01) |

(52) U.S. Cl.
CPC .............. *H04N 25/78* (2023.01); *H03M 1/38* (2013.01); *H04N 25/771* (2023.01); *H04N 25/709* (2023.01)

(58) Field of Classification Search
CPC ........ H04N 5/14; H04N 25/70; H04N 25/709; H04N 25/771; H04N 25/78; H03M 1/38
See application file for complete search history.

(56) References Cited

U.S. PATENT DOCUMENTS

| | | | |
|---|---|---|---|
| 10,979,065 B1 * | 4/2021 | Chang ..................... | H03M 1/66 |
| 2023/0156359 A1 * | 5/2023 | Teo ......................... | H04N 25/78 |
| | | | 348/231.99 |

OTHER PUBLICATIONS

Funatsu, Ryohei, et al. "6.2 133Mpixel 60fps CMOS image sensor with 32-column shared high-speed column-parallel SAR ADCs." 2015 IEEE International Solid-State Circuits Conference—(ISSCC) Digest of Technical Papers. IEEE, 2015, 3 pages.
An-Qiang Guo, et al., "A 10-Bit CMOS SAR ADC for Low-Power Sensor Applications", 2018 14th IEEE International Conference on Solid-State and Integrated Circuit Technology (ICSICT), IEEE, 2018, 3 pages.

* cited by examiner

*Primary Examiner* — Lin Ye
*Assistant Examiner* — Chriss S Yoder, III
(74) *Attorney, Agent, or Firm* — Brake Hughes Bellermann LLP

(57) ABSTRACT

A high dynamic range (HDR) imaging system is disclosed in which the speed of digitizing and storing image data is increased by efficient signal management, without a need for additional resources. By managing the data transfer process in a successive approximation register (SAR) analog-to-digital converter (ADC) circuit, using techniques such as synchronization of control signals, multi-stage memory, and time-multiplexing, higher frame rates can be achieved without relying on increasing bandwidth with additional channels, or increasing power consumption or complexity of the imaging system.

21 Claims, 11 Drawing Sheets

600

Time t1

610

Time t2

800

802
Amplification

804
Digitization

806
Set next bit

808
Conditional Reset

810
Serial transfer to memory

812
Parallel bit transfer

HIGH-SPEED IMAGER CIRCUIT

TECHNICAL FIELD

This description relates to digital imaging systems. More specifically, this description relates to efficiency improvements in digitizing and storing large amounts of image data at high speeds.

BACKGROUND

Imaging systems that include image sensors and associated electronics can be used in a number of image-processing applications, including digital cameras, smart phones, video surveillance equipment, security systems, industrial applications, and automotive sub-systems such as light detection and ranging (LiDAR). An array of image sensors can be implemented as an active area of a semiconductor image sensor die. A high dynamic range (HDR) imaging system produces high quality images having a high resolution and a wide range of light and dark tones with greater variation in color, brightness, and contrast than a standard dynamic range (SDR). Because HDR imaging systems gather and store large volumes of data, efficiency is a central concern.

SUMMARY

In some aspects, the techniques described herein relate to a circuit, including: an analog-to-digital converter (ADC) configured to produce a bit representing a portion of image data received from an image sensor; a comparator configured to produce an output based on a comparison of a bit level of the bit to a reference voltage; conditional logic configured to generate a bit reset signal based on the output of the comparator; a set-reset enabled latch configured to maintain or reset the bit level based on the bit reset signal; and an analog multiplexer configured to perform a serial data transfer of the bit to a memory.

In some aspects, the techniques described herein relate to a circuit, wherein the comparator includes an operational amplifier and an output latch configured to output a signal from the operational amplifier.

In some aspects, the techniques described herein relate to a circuit, wherein the comparator is configured to execute a binary search algorithm.

In some aspects, the techniques described herein relate to a circuit, wherein the binary search algorithm re-sets the bit level when the bit level is outside a reference voltage range that includes a high reference voltage and a low reference voltage.

In some aspects, the techniques described herein relate to a circuit, wherein the set-reset enabled latch is configured to perform a voltage level shift.

In some aspects, the techniques described herein relate to a circuit, wherein the conditional reset logic maintains the bit level when the bit level is above a low reference voltage.

In some aspects, the techniques described herein relate to an apparatus, including: an amplifier configured to produce an amplified signal based on an output of a pixel array of an image sensor; a successive approximation register (SAR) analog-to-digital converter (ADC) circuit configured to digitize the amplified signal as a bit stream; a first memory configured to serially receive the bit stream, from the SAR ADC circuit; a second memory configured to receive bits of the bit stream in parallel, from the first memory; and register transfer logic (RTL) configured to transfer the bits in parallel to an image processor.

In some aspects, the techniques described herein relate to an apparatus, wherein the apparatus is a camera suitable for use in an automotive system.

In some aspects, the techniques described herein relate to an apparatus, wherein a first control signal of the SAR ADC circuit configured to initiate storage of a first bit is synchronized with a second control signal configured to initiate digitization of a second bit.

In some aspects, the techniques described herein relate to an apparatus, wherein the SAR ADC circuit includes a memory readout stage.

In some aspects, the techniques described herein relate to an apparatus, wherein the memory readout stage is implemented as an analog multiplexer (MUX).

In some aspects, the techniques described herein relate to a method, including: amplifying an output voltage of a pixel in a pixel array of an image sensor; sampling the pixel to produce a digital amplified signal; storing the digital amplified signal in a memory by performing a serial bit transfer; and transferring data from the memory to an image processor by performing a parallel bit transfer.

In some aspects, the techniques described herein relate to a method wherein the serial bit transfer is performed at a high frequency in a range of about 130 MHz to about 150 MHz.

In some aspects, the techniques described herein relate to a method, wherein the parallel bit transfer is performed at a low frequency in a range of about xxx to yyy.

In some aspects, the techniques described herein relate to a method, wherein the storing is accomplished in a time interval of about 4 ns to about 8 ns.

In some aspects, the techniques described herein relate to a method, wherein the storing is accomplished in a time interval of about 40 ns to about 60 ns.

In some aspects, the techniques described herein relate to a method, wherein the parallel bit transfer occurs after the serial bit transfer stores all bits in the memory.

In some aspects, the techniques described herein relate to a method, further including processing the image data in parallel using register transfer logic (RTL).

In some aspects, the techniques described herein relate to a method, wherein the serial bit transfer includes: setting a bit; performing a conditional reset based on a comparison of a signal level of the bit to a reference voltage; transferring the bit to the memory; and repeating the setting, performing, and transferring operations for each bit in the digital amplified signal.

In some aspects, the techniques described herein relate to a method, wherein the conditional reset includes amplifying the signal level of the bit.

Figure 1:
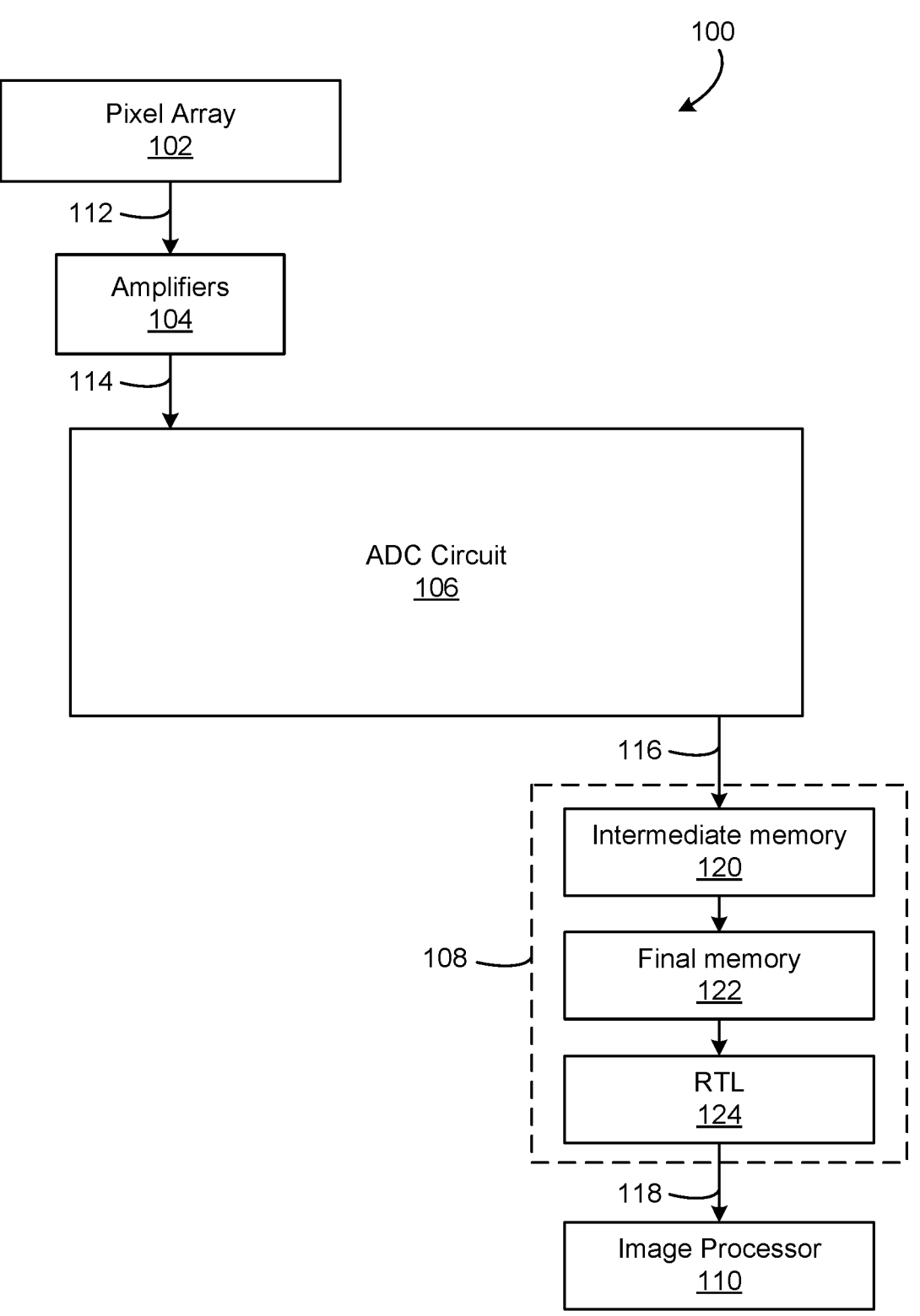
FIG. 1 is a block diagram of an imaging system, according to implementations of the present disclosure.

Aspects of the present disclosure are best understood from the following detailed description when read with the accompanying figures. It is noted that, in accordance with common practice in the industry, various features are not necessarily drawn to scale. Dimensions of the various features may be arbitrarily increased or reduced for clarity of discussion. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

In the digital imaging systems described herein, light captured by image sensors is converted to an electrical signal, digitized by an analog-to-digital converter (ADC), and stored as image data. Each image, or frame, is made up of a two-dimensional (2-D) array, or matrix, of pixels. The size of the pixel array defines the resolution of the image. The number of frames per second that the image sensors are capable of capturing can be referred to as the frame rate. As the frame rate increases, more resources are needed to digitize and store the image data.

At least some of the concepts described herein provide improvements in the efficiency of data storage by reducing the ADC-to-memory transfer time. By managing data transfer using the techniques described herein, efficiency can be improved to support operation of the digital imaging system at higher frame rates. For example, instead of transferring 45 frames per second, with an improved data transfer scheme, it may be possible to transfer 50 frames per second of image data to a digital memory, increasing the frame rate by about 10%, or by an amount in a range of about 7% to 13%.

The data transfer process can be improved in several different aspects. When data is transferred serially between the ADC and the memory, that is, one bit (pixel) at a time, the image resolution dictates a number of clock cycles needed to store each image frame. In some systems, a first clock pulse advances a bit from the ADC to an output bus and a second, non-overlapping, clock pulse latches the ADC data bit into memory. The first and second clock pulses are separated by a time delay. Meanwhile, the ADC remains idle during these transfer operations, which is a time-inefficient use of the clock cycles. Consequently, re-structuring the timing of ADC operations and memory transfer operations can improve efficiency of the digital imaging system. For example, the same control pulse that is used to latch data into the memory can simultaneously be used to complete analog-to-digital conversion of the next bit. Further, by synchronizing the storage and next-bit digitization operations, the clock frequency can be reduced, thus saving power.

In some implementations, storing data in a multi-stage memory, using an intermediate memory as a buffer, can further speed up the ADC-to-memory transfer process. The buffer can accept data at times when the final memory is busy and would otherwise have caused a delay in data transfer. Without the advantage of a buffer, when delays occur, additional clock cycles may be needed to advance the data transfer. One way to compensate for additional clock cycles is to increase the clock frequency. However, a higher clock frequency may require more power in some implementations.

In some implementations, the number of data channels can be increased from, for example, 16 channels to 20 channels for a frame rate of 60 FPS, or from 32 channels to 40 channels, for a frame rate of 100 FPS. Additional channels can process more frames in parallel within a given number of clock cycles, thus facilitating a higher frame rate. In some implementations, a time-multiplexed data transfer scheme can be used to compress more data into each channel, and thus to avoid having to increase the number of channels.

Image sensors that operate at a high frame rate can benefit from implementing a high-speed ADC-to-memory transfer, at a high frequency, without requiring additional power. In some implementations, simulations indicate that such a reduction in transfer time alone can cause an 8 megabyte image sensor to sustain a frame rate increase between 7% and 8% to support a frame rate up to about 55 frames/second. A 12 megabyte image sensor can sustain a frame rate increase between about 12% and 14% to support a frame rate up to about 50 frames/second. Such an improvement in transfer time precludes increasing the number of channels to achieve a similar frame rate, without consuming additional power.

In some implementations, by managing the data transfer process using techniques such as clock synchronization, multi-stage memory, and time-multiplexing, higher frame rates can be supported without having to rely on increasing bandwidth with additional channels and/or without having to accommodate increased power consumption or complexity of the imaging system. In some implementations, the number of channels can be decreased, while the frequency is maintained at, for example, 100 MHz. In some implementations, the clock frequency can be decreased from, for example, 156 MHz to 90 MHz.

FIG. 1 is a high-level block diagram of components and signals in an imaging system 100, according to some implementations of the present disclosure. The imaging system 100 can be used in various automotive imaging applications such as, for example, backup cameras or laser-based LiDAR units aboard driverless vehicles. Such applications feature HDR image capture in real time at high frame rates. The imaging system 100 includes, as basic components, a plurality of image sensors in the form of a pixel array 102, and associated electronic components such as amplifiers 104, an analog-to-digital converter (ADC) circuit 106, a memory 108, and an image processor 110.

As shown in FIG. 1, the imaging system 100 is configured to process image data associated with the pixel array 102 and produce image data 118 for the image processor 110. The processing through a pipeline of the imaging system 100 is shown in FIG. 1 and includes charging pixels within the pixel array 102, amplifying a pixel array output voltage signal 112 to create an amplified analog signal 114, converting the amplified analog signal 114 to a digital signal 116, and saving the digital signal 116 in the memory 108 as image data 118 for subsequent processing by the image processor 110.

The pixel array 102 is an array of image sensors in which each element, or pixel, of the pixel array 102 functions as a transducer that converts incident light into a voltage signal. In some implementations, the pixel array 102 is an array of image sensors including complementary metal oxide semiconductor (CMOS) image sensors. Collectively, the voltage signals of a plurality of pixels in the pixel array 102 form the pixel array output voltage signal 112. The amplifiers 104 can be configured, in at least some implementations, to produce the amplified analog signal 114.

The ADC circuit 106 is configured to convert the amplified analog signal 114 output from the pixel array 102 to the digital signal 116. The digital signal 116 can then be stored as image data 118 in the memory 108. More detailed components of the ADC circuit 106 and the processing pipeline described in connection with FIG. 1 are shown and described in connection with at least FIG. 2 and FIG. 3.

In some implementations, the memory 108 shown in FIG. 1 can be a multi-stage memory that includes an intermediate memory 120 and a final memory 122. The memory 108 can further include a register transfer logic (RTL) circuit 124 that transfers the image data 118 from the final memory 122 to the image processor 110. One advantage of using a multi-stage memory is that data can be transferred to the intermediate memory 120 while the final memory 122 is busy. In some implementations, data transfer to the intermediate memory 120 is performed as a serial bit transfer, while data transfer to the final memory 122 is performed as a parallel transfer that occurs after all bits are received in the intermediate memory 120. Then subsequent transfers out of the final memory 122 can be made as parallel transfers, at the same time, that bits are accumulated in the intermediate memory 120. Data transfer through the memory 108 is described further below, with reference to at least FIGS. 3, 6A, 6B, and 6C.

Figure 2:
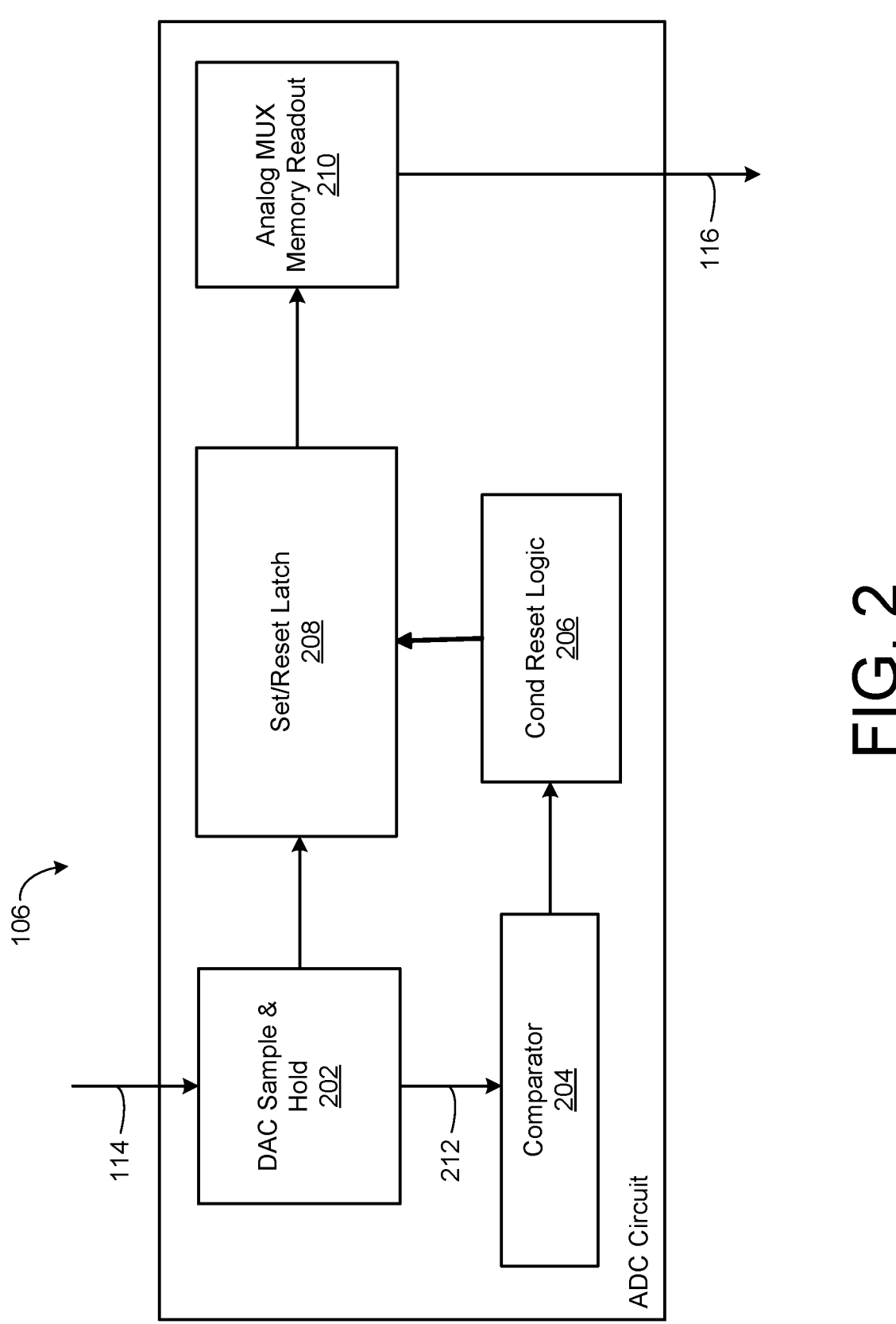
FIG. 2 is a block diagram of an Analog-to-Digital converter (ADC) circuit, according to implementations of the present disclosure.

FIG. 2 is a high-level block diagram showing components of the ADC circuit 106, according to some implementations of the present disclosure. In some implementations, the ADC circuit 106 includes a DAC sample-and-hold module 202, a comparator 204, conditional reset logic 206, a set/reset latch 208, and an analog multiplexer (MUX) memory readout 210.

In some implementations, the DAC sample-and-hold module 202 converts the amplified analog signal 114 (also shown in FIG. 1) to a digital signal 116 by sampling analog waveforms. One or more of the other components in the ADC circuit 106 may be configured to reduce the transfer time between the DAC sample-and-hold module 202 and the memory 108. In the imaging system 100, the speed of image capture can be limited by the sampling time in the DAC sample-and-hold module 202, the conversion time in the DAC sample-and-hold module 202, or the ADC-to-memory transfer time. The sampling time and the conversion time associated with the ADC circuit 106 are both dependent on power consumption for a given resolution and an internal sampling capacitor within the DAC sample-and-hold module 202. The ADC circuit 106 operation ends when image data output from the ADC circuit 106 is transferred to the memory 108 by other components of the ADC circuit 106. In some implementations, the transfer to the memory 108 can be executed by the analog MUX memory readout 210.

In some implementations, the ADC circuit 106 can be a successive approximation register (SAR) type ADC circuit, in which the amplified analog signal 114 is compared against a reference voltage by the comparator 204. The conditional reset logic 206 then sets and maintains a first binary signal as a high output, or digital "1," when the amplified analog signal 114 exceeds the reference voltage. The conditional reset logic 206 resets to a second binary signal as a low output, or digital "0," when the amplified analog signal 114 is lower than the reference voltage. In some implementations, the SAR ADC circuit can be a high frequency SAR ADC circuit that operates at a frequency in a range of about 100 MHz to about 200 MHz.

The set/reset latch 208 is configured to function as an internal storage unit to retain the resulting bit value of the conditional reset logic 206 until it can be released to the intermediate memory 120 shown in FIG. 1. In some implementations, the set/reset latch 208 can be defined using multiple NAND logic gates, or a combination of AND and XOR logic gates.

The analog MUX memory readout 210 is also configured to execute a bit-by-bit transfer to the intermediate memory 120 shown in FIG. 1. The serial transfer can be time-multiplexed to move the data faster. Consequently, fewer data channels are needed, and dedicated clock cycles need not be spent for the ADC-to-memory transfer operation. By extending an output pulse length to encompass multiple clock cycles, timing requirements can be relaxed during the memory transfer operation.

Figure 3:
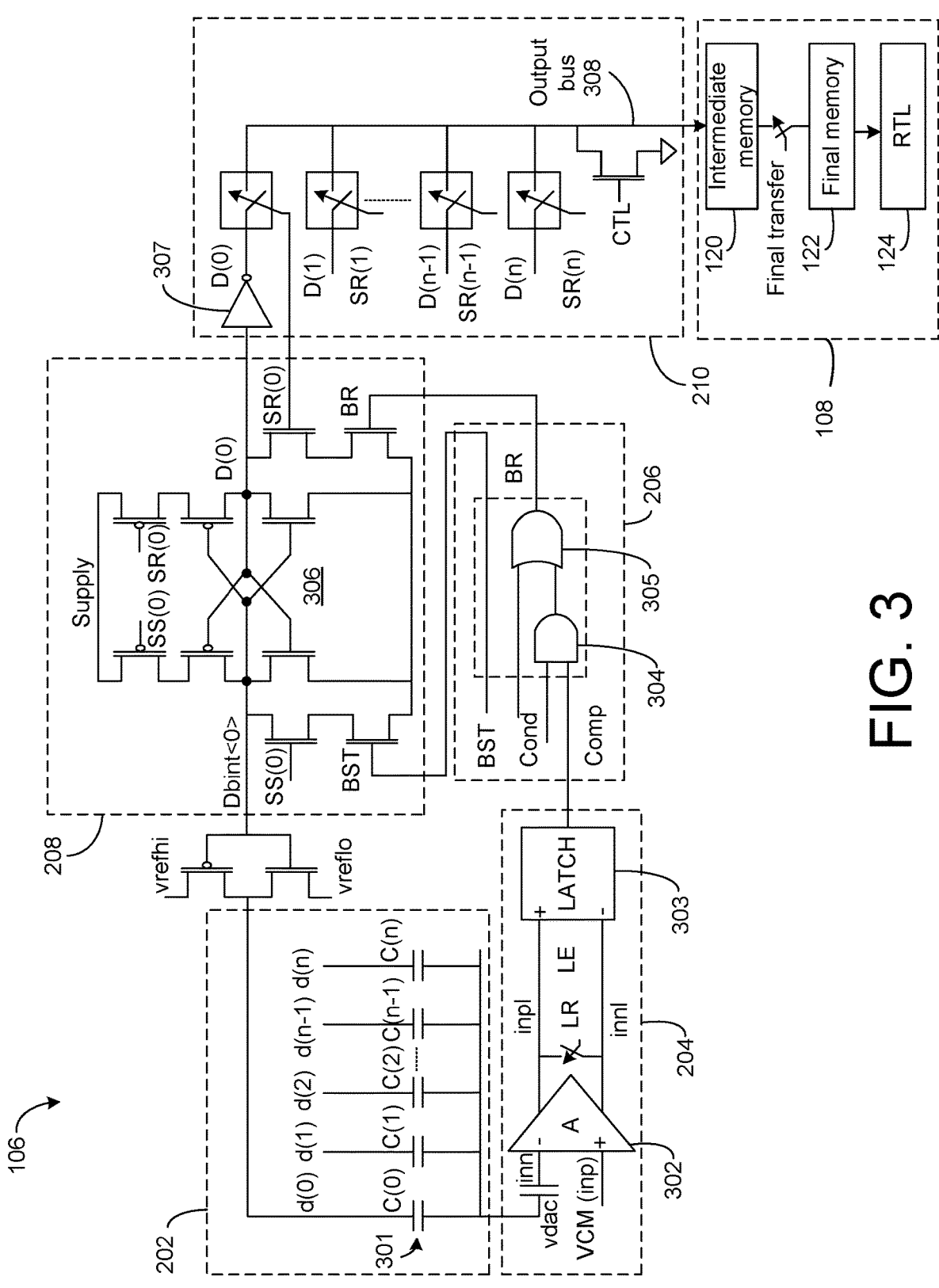
FIG. 3 is a circuit schematic of the ADC circuit shown in FIG. 2, according to implementations of the present disclosure.

FIG. 3 is a detailed schematic circuit diagram that illustrates a detailed version of the ADC circuit 106 shown in FIGS. 1 and 2, according to some implementations of the present disclosure. The circuit shown in FIG. 3 is an example of one possible implementation of the ADC circuit 106 shown in FIG. 2, configured to produce the digital signal 116 (shown in FIGS. 1 and 2) from the amplified analog signal 114 (shown in FIGS. 1 and 2).

Specifically, FIG. 3 shows circuit elements and control signals within each of the component blocks of the ADC circuit 106 of FIG. 2, including the DAC sample-and-hold module 202, the comparator 204, conditional reset logic 206, the set/reset latch 208, and analog MUX memory readout 210. The operation and timing of the circuit elements and control signals shown in FIG. 3 is further described below with reference to FIGS. 4-8. In particular, the control signals shown throughout FIG. 3 are related by the timing diagrams described below with reference to FIGS. 5A-5Q.

In some implementations, the DAC sample-and-hold module 202 includes DAC capacitors 301 (labeled as capacitors C(0) through C(n)) configured to receive analog image signals d(0) to d(n). In this implementation, one bit at a time is transmitted from the DAC sample-and-hold module 202 to the comparator 204. In some implementations, more than one bit at a time can be transmitted to the comparator 204.

Figures 5A, 5B, 5C, 5D, 5E:
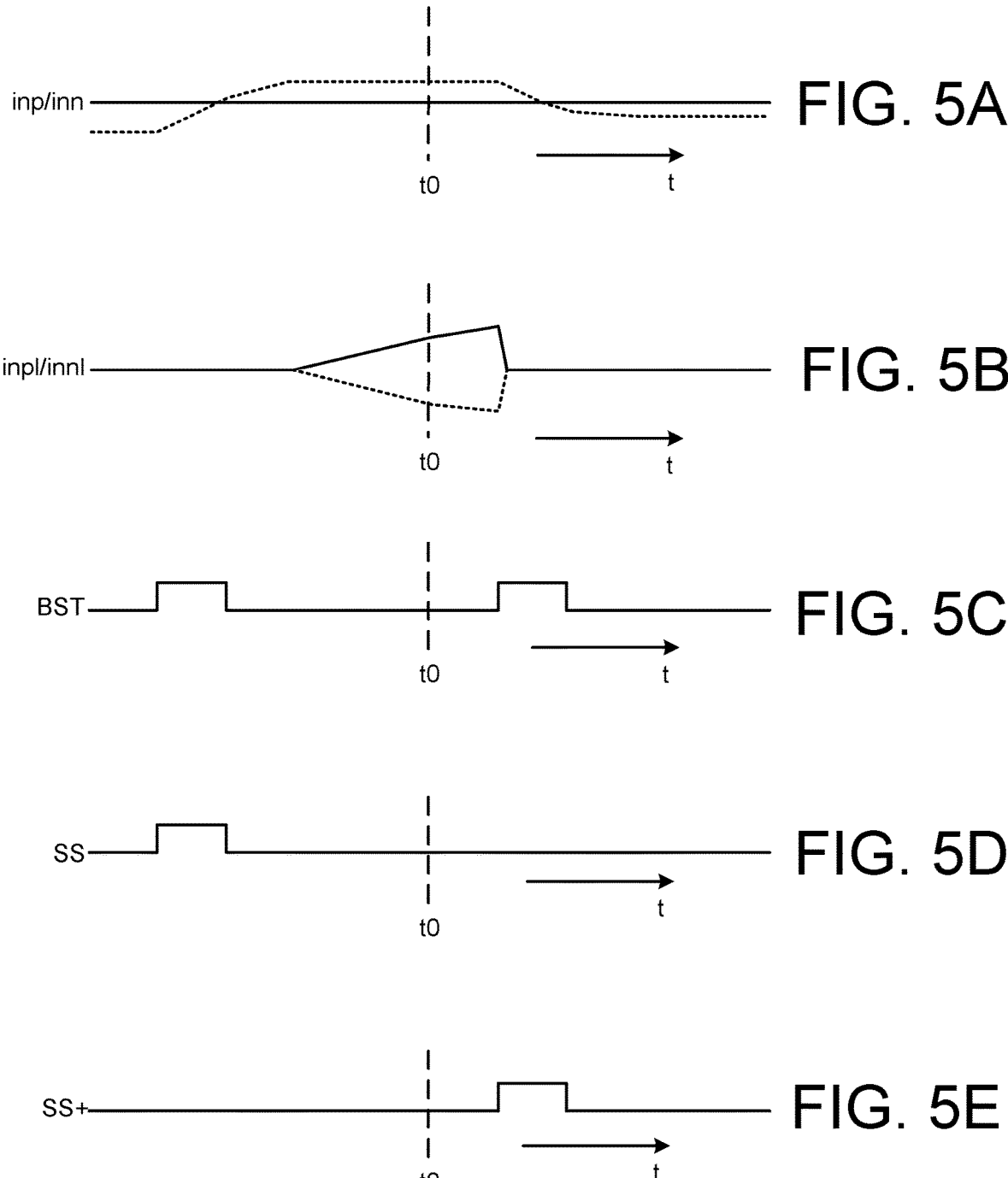
FIGS. 5A-5Q are timing diagrams illustrating control signals triggering the flow of data through the ADC circuit shown in FIG. 3, according to implementations of the present disclosure.
Figures 5F, 5G, 5H, 5I, 5J:
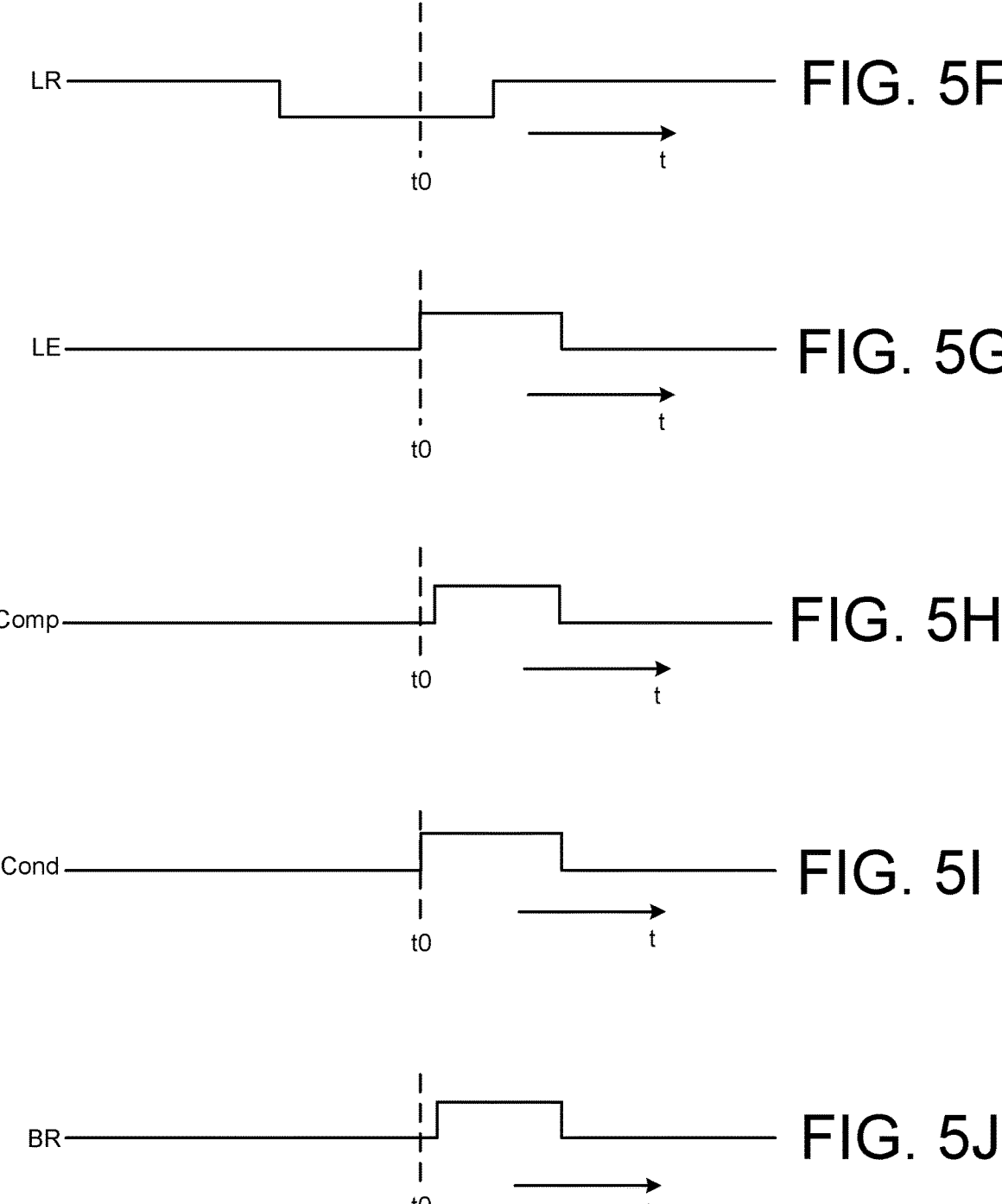

In some implementations, the comparator 204 can be configured to include an operational amplifier (op-amp) 302 and a latch 303. The op-amp 302 can be configured to compare a negative input signal inn from the DAC sample-and-hold module 202 against a positive input coupled to a common mode voltage input VCM. The difference at the input of the comparator 204 is the input signal-VREF. The latch 303 can be controlled by a latch reset switch LR and a latch enable signal LE. With reference to FIGS. 5A, 5B, and 5G, the latch enable signal LE turns on after sufficient amplification of the output signals inpl and innl has taken place, at which time the output of the latch 303 is transmitted to the conditional reset logic 206.

In some implementations, circuit elements within the conditional reset logic 206 can include an AND gate 304 coupled to an OR gate 305. If both the output of the comparator 204, "Comp," and a DAC conditional reset signal "Cond" are high, the output of the AND gate is high. The output of the OR gate 305 is a bit reset signal BR that feeds the set/reset latch 208. The bit set signal BST bypasses the conditional reset logic 206 and proceeds to the set/reset latch 208. In some implementations, based on the output of the comparator 204, the set-reset logic 206 can be configured to execute a binary search. The binary search can be used to determine in which voltage domain to set a bit, that is, a digital representation corresponding to a given analog signal, for example, the analog signal d(0), as described further below with reference to FIG. 4.

In some implementations, the set/reset latch 208 can be configured as a SAR set/reset latch 306 to output a digital image data signal D(0) and a switching signal SR(0) to the MUX memory readout 210. The switching signal SR(0) can be configured to control the conditional reset of a previously converted bit while also controlling bit transfer of data output to bus "doutb" onto the output bus 308. Operation of the set/reset latch 208 is described further below, with reference to at least FIG. 7.

In some implementations, elements within the MUX memory readout 210 can include an inverter 307, data bits D(0) to D(n), an output bus 308, select readout switches SR(0) to SR(n), and a control signal CTL. The select readout switches select a data bit doutb to deliver to the output bus 308 and the control signal CTL executes a transfer of the bit to the intermediate memory 120. The inverter 307 compensates for a pull-down that occurs in the SAR set/reset latch 306 in which the data bit to become isolated from the supply voltage.

In some implementations elements within the memory 108 include an intermediate memory 120 and a final memory 122. A switch between the intermediate memory 120 and the final memory 122 allows a transfer of data to the final memory 122 as soon as a previous data set has been transferred to the RTL. Data transfer through the memory 108 is described further below, with reference to at least FIGS. 6A, 6B, and 6C.

Figure 4:
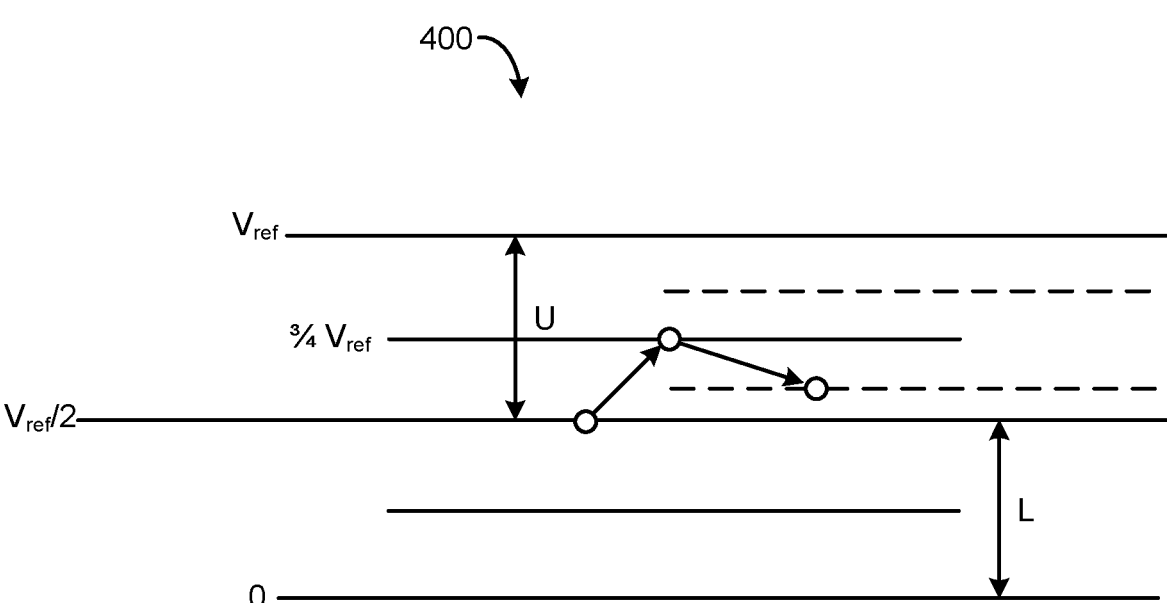
FIG. 4 is a voltage plot 400 illustrating an iterative binary search, according to implementations of the present disclosure.
Figure 6A:
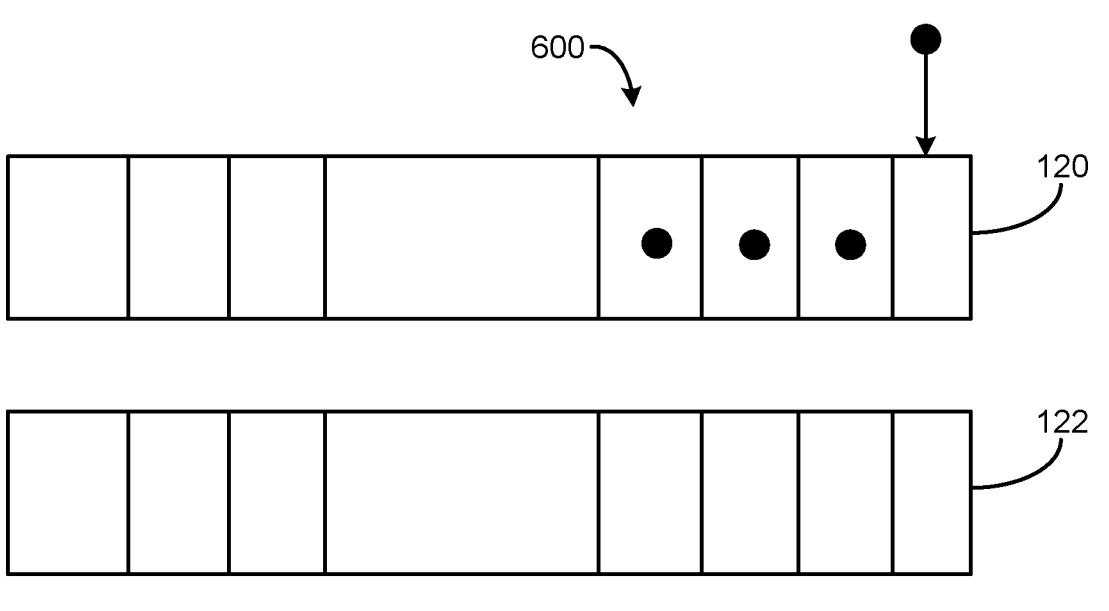
FIGS. 6A, 6B, and 6C are a series of pictorial views illustrating an ADC-to-memory transfer process, according to implementations of the present disclosure.
Figure 6B:
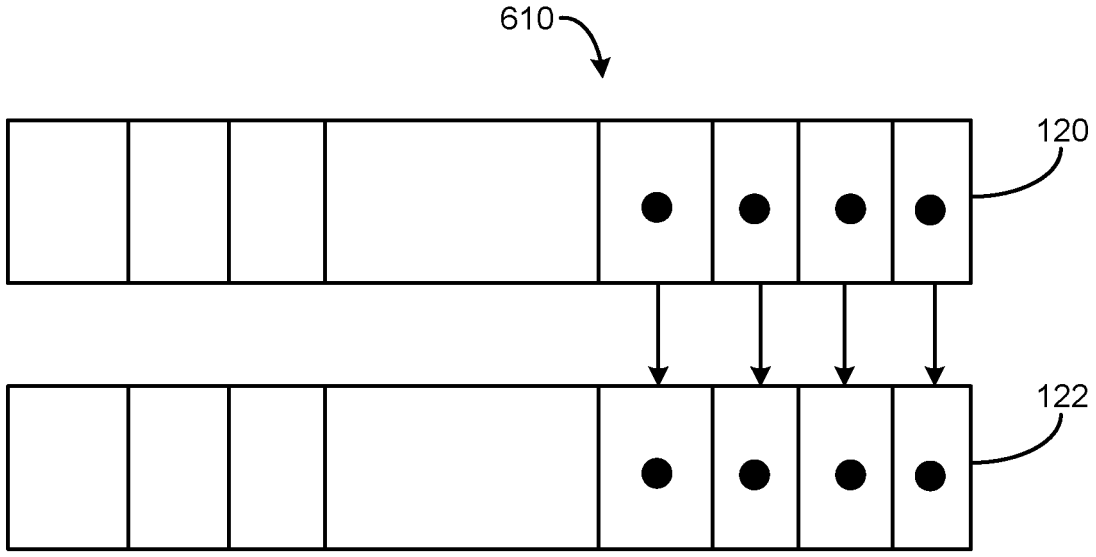
Figure 6C:
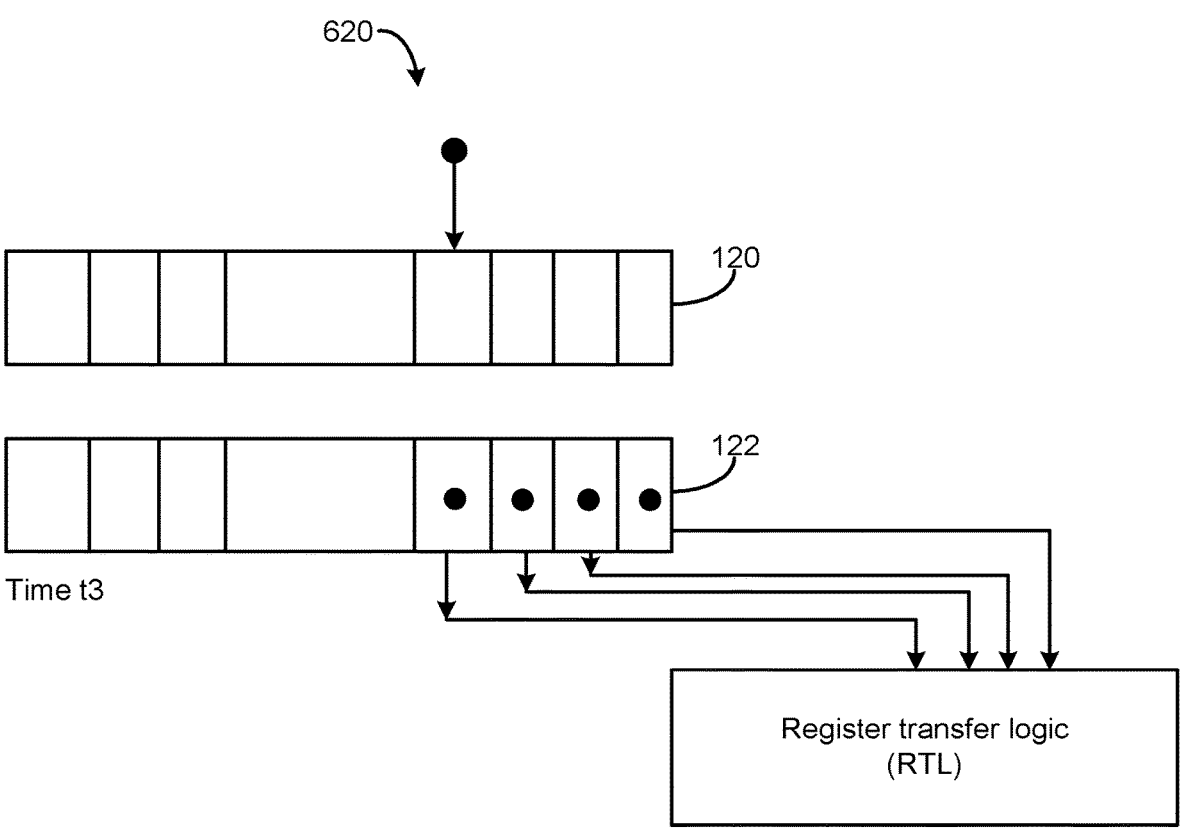
Figure 7:
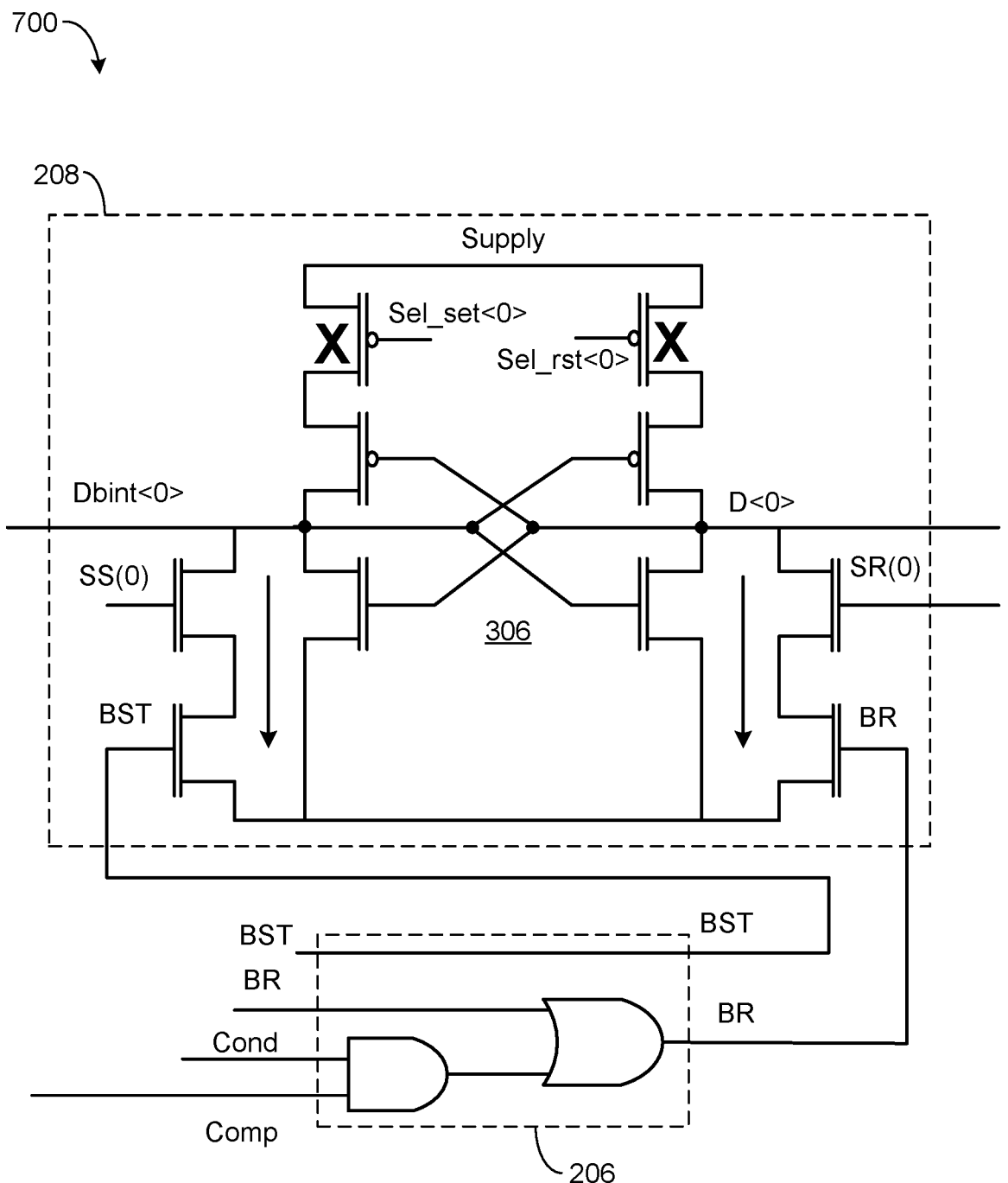
FIG. 7 is a magnified view of a SAR set/reset latch, according to implementations of the present disclosure.
Figure 8:
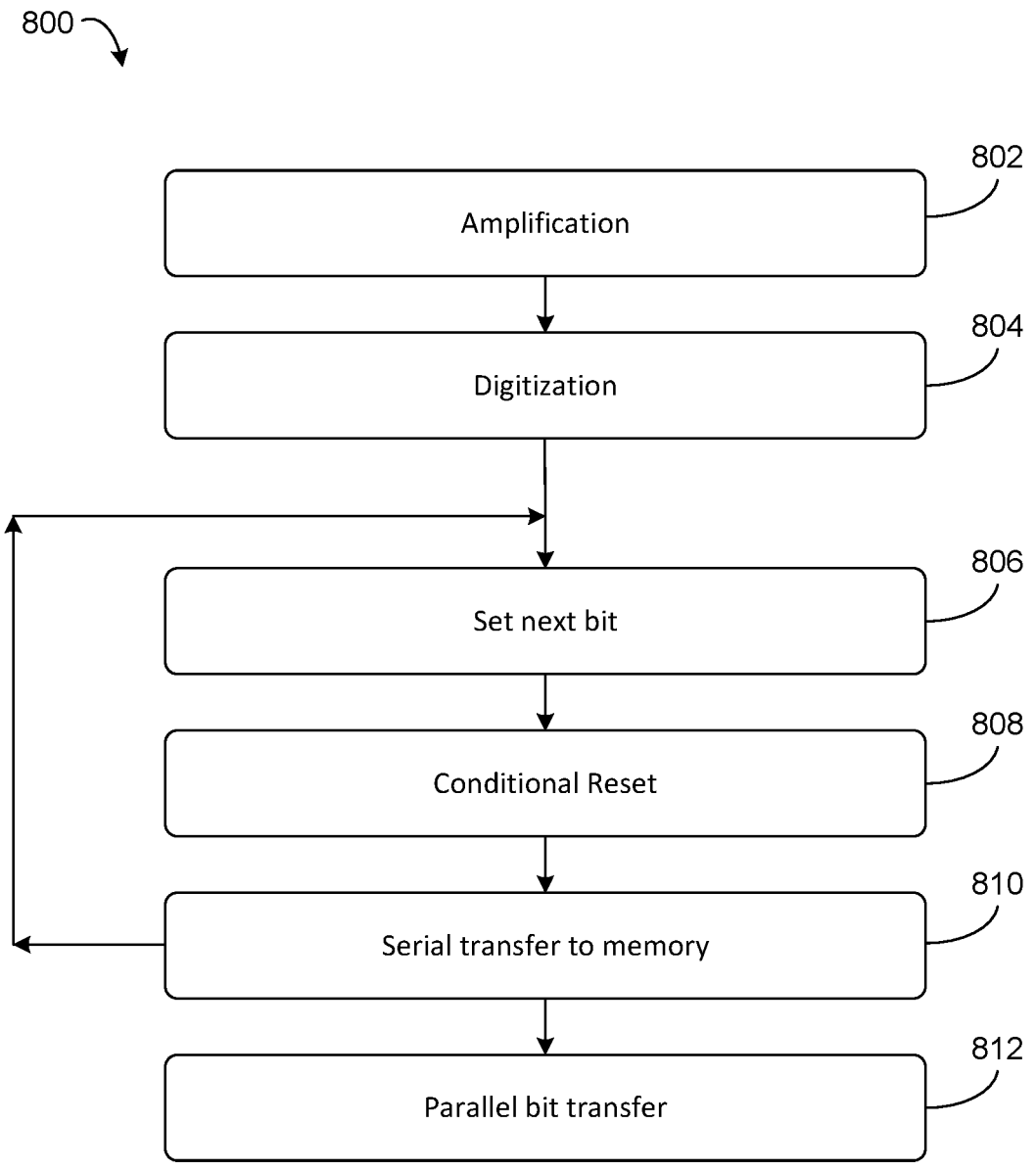
FIG. 8 is a flow diagram illustrating a method of processing and storing image data, according to implementations of the present disclosure.

The operation of, and relationships between, the circuit elements and control signals shown in FIG. 3 are explained further with reference to FIGS. 4-8 below. FIG. 4 illustrates a binary search type algorithm for setting a voltage value for each data bit D(0) to D(n) based on comparison against a reference voltage, as executed by the comparator 204 and the conditional reset logic 206. FIGS. 5A-5J illustrate digital signals shown in FIG. 3 as a function of time to illustrate temporal relationships between the various signals. FIGS. 6A, 6B, and 6C show a time progression of bits being stored in components of the memory 108 shown in FIG. 3. FIG. 7 reproduces the central components of FIG. 3, including the conditional reset logic 206 and the set/reset latch 208 implemented as the SAR set/reset latch 306. Finally, FIG. 8 presents a progression of data through the imaging system 100 as a series of operations including a repeated set of operations that are performed serially for each bit D(0 . . . n).

FIG. 4 illustrates voltage domains for setting bit values, in accordance with some implementations of FIGS. 1 through 3 of the present disclosure. Signals from the pixel array 102 are amplified by amplifiers 104 and sampled by the DAC sample-and-hold module 202 to provide serial inputs to the comparator 204 for comparison against a reference voltage signal VREF. Based on the comparison, the bit value can be set by the signal BST and maintained above VREF. Otherwise, the bit value can be reset by the signal BR.

Voltages range from 0 to a reference voltage VREF, where VREF/2 is the center of the voltage range. In at least a first iteration, a bit value can be set to VREF/2. In some implementations, each bit can be compared against VREF/2 to determine whether the bit should be set to a value in the lower domain L between 0 and VREF/2, or set to a value in the upper domain U between VREF/2 and VREF. Then the process can be repeated to narrow down the voltage domain by half in each iteration. For example, if the bit value is found to be in the upper domain U, it is reset from VREF/2 to ¾ VREF. Then in the next iteration the bit can be compared to ¾ VREF to determine whether the bit should be re-set within the upper domain U to the upper dashed line or the lower dashed line. In this way, the voltage domains can be used to locate the correct voltage represented by the bit.

Figures 5K, 5L, 5M, 5N, 5P, 5Q:
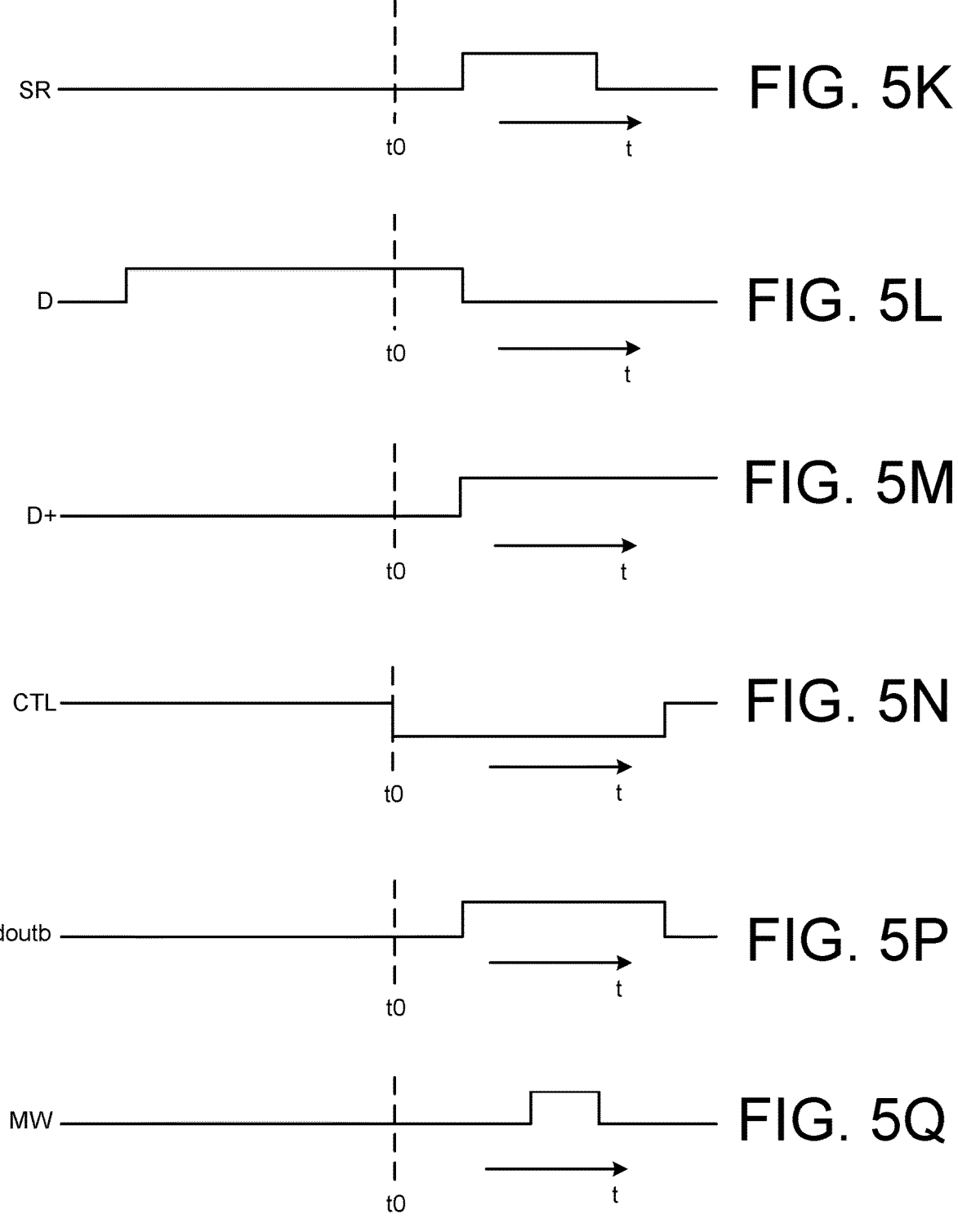

FIGS. 5A-5Q are a series of timing diagrams that illustrate operation of the circuit FIG. 3, in accordance with some implementations of the present disclosure. Specifically, the timing diagrams plot various signals shown in FIG. 3 as a function of time (t). The digital control signals advance data serially, as a bit stream, through elements of the ADC circuit 106. By processing each bit as it becomes available, waiting time is eliminated at each step, prior to storage in the final memory 122. Such relaxed timing results in greater efficiency of the ADC circuit 106 without increasing complexity or adding components.

FIGS. 5A and 5B are plots of analog signals inp/inn and inpl/innl as a function of time, respectively, which are inputs to the op-amp 302. FIG. 5B shows amplification of the signals inpl and innl occurring around time t0.

The digital control signals include the bit set signal BST shown in FIG. 5C, a select set signal SS for a current bit shown in FIG. 5D, and a select set signal SS+ for a next bit shown in FIG. 5E. The conditional reset logic 206 produces the control signals BST and BR (see FIG. 5J), which are further results of the binary search algorithm, described above with reference to FIG. 4, and which function as inputs to the SAR set/reset latch 306.

Digital control signals further include the latch reset signal LR shown in FIG. 5F, the latch enable signal LE shown in FIG. 5G, the comparator output signal Comp shown in FIG. 5H, the conditional bit reset signal Cond shown in FIG. 5I, and the bit reset signal BR shown in FIG. 5J. The digital control signals LR (latch reset) and LE (latch enable) trigger the flow of the output of the comparator 204, Comp, to the input of the conditional reset logic 206 via the latch 303. The output of the comparator 204 is a partial result of the binary search algorithm described above with reference to FIG. 4.

Digital control signals further include a select reset signal SR(0 . . . n) shown in FIG. 5K, digitized current bit data D shown in FIG. 5L, next bit data D+ shown in FIG. 5M, the bus output control signal CTL shown in FIG. 5N, data output to bus doutb shown in FIG. 5P, and a memory write signal MW(0 . . . n) shown in FIG. 5Q, where n is the ADC resolution. D(0) to D(n) represent data bits that are staged in the MUX memory readout 210. The control signals SS and SR(0) to SR(n) select the next data bit in the MUX memory readout 210 to be placed on the output bus as doutb. The duration of the SR signal can be extended for multiple cycles until the next bit decision to allow a lower frequency ADC-to-memory transfer. In some implementations, the control signal SR that is used to control the bit transfer onto the output bus for storage in the memory 108 is also used as a latch to control the conditional reset of the previously converted bit in the SAR set/reset latch 208.

The control signals CTL, and MW(0) to MW(n) trigger the serial storage of bits in the memory 108. When the signal CTL transitions to low, a transfer of the selected bit data via the output bus is triggered, from the MUX memory readout 210 to the intermediate memory 120 as a memory write operation MW. Since the control signal CTL remains low for multiple cycles, any of the signals associated with memory readout, including data output to the bus "doutb" and MW, can be extended for multiple cycles as desired until the next bit decision and need not be synchronized with one another.

FIGS. 5N and 5G further illustrate the coordination of signals that facilitates time multiplexing, particularly the coordination of control signals CTL and LE. At a time t0, the control signal CTL can be synchronized with the latch enable control signal LE to initiate storage of a first bit in the memory 108 by the MUX memory readout 210 at the same time that digitization of a next bit by the comparator 204 is initiated. In response to the next bit being available, the next bit can be stored in the memory 108 without delay. Further, during the time that the control signal CTL remains low, there is flexibility as to when the memory transfer-related signal transitions can be initiated, and their pulse widths can vary as needed. Consequently, with this relaxation of the timing, the clock frequency can be reduced. The additional overhead that is now available can be utilized for any of the ADC operations allowing such operations to be executed at a slower rate. In some implementations, the storing operation can be accomplished in a time interval of about 40 ns to about 60 ns. In some implementations, the storing operation can be accomplished in a time interval of about 4 ns to about 8 ns.

FIGS. 6A, 6B, and 6C illustrate data flow through elements of the memory 108, in accordance with some implementations of the present disclosure. The intermediate memory 120 can be used as a buffer to store data one bit at a time for further processing by the register transfer logic (RTL). As shown in diagram 600 of FIG. 6A, individual bits (four shown) are input serially into the intermediate memory 120 and retained until all of the bits are present. In some implementations, the serial bit transfer can be performed at a frequency in a range of about 130 MHz to about 150 MHz. Then, at a time t2, when a register of the intermediate memory 120 is full, all of the bits are output at once to the final memory 122 as shown in diagram 610 of FIG. 6B. At times t1 and t2, the RTL is not interrupted and remains free to process other data. Then, at a time t3, register contents are transferred in parallel from the final memory 122 to the RTL as shown in diagram 620 of FIG. 6C. In some implementations, the parallel bit transfer can be performed at a frequency in a range of about 130 MHz to about 150 MHz for image data processing. Meanwhile, at time t3, serial bit transfer into the intermediate memory 120 can resume. This multi-step buffered data transfer scheme allows for increased operational efficiency of the RTL.

In some implementations, the ADC-to-memory transfer can occur substantially simultaneously with a memory-to-RTL data transfer. The transfer from intermediate latch to final latch will happen after all the bits from the ADC are available and the column memory data stored in the MUX memory readout 210 is empty.

FIG. 7 is a magnified view 700 of the SAR set/reset latch 306 and the conditional reset logic 206, in accordance with some implementations of the present disclosure. In some implementations, the SAR set/reset latch 306 functions as both an internal bit storage device and a voltage level shifter. For example, the SAR set/reset latch 306 can shift the logic signal from about 1.2 V to about 1.8 V so that the ADC, SAR logic, and latches are in different voltage domains, without losing the logic information. In some implementations, the comparator latch and the SAR set-reset logic 206 are in a lower voltage domain. Because level shifting is performed by the SAR, no additional circuitry or associated circuit layout area is needed. Likewise, without the need for additional circuitry, no further power consumption occurs.

In some implementations, the power supply to the SAR set/reset latch 306 is disconnected during set/reset operations so that a pullup transistor in the SAR set/reset latch 306 is engaged to avoid a short circuit during a latch write operation. During a set operation, the power supply can be disconnected from the set side by the select set switch SS so that the voltage on the set side is controlled by the BST signal. Likewise, during a reset operation, the power supply can be disconnected from the reset side by the SR switch so that the voltage on the reset side is controlled by the BR signal. The pullup transistor also can be configured to increase the speed of the latch write operation by reducing current flow from the opposite side of the complementary logic.

With reference to FIGS. 5 and 7, in some implementations, the inverter 307 can be used to un-toggle the data output doutb (logic '0') by the control signal CTL. In non-reset cases, D(0) has no path to the power supply during a conditional reset. Therefore, there is a need to drive doutb to zero with D(0) equal to a floating logic '1.'

In some implementations, switches within the SAR set/reset latch 306 are located on the latch reset side to transfer the bit during conditional reset of that bit position, following a decision by the comparator 204. This switch, e.g., SR(0), is controlled by the same signal that is conditionally resetting the SAR set/reset latch 306. Therefore, no extra clock cycle is needed to transfer a bit to the MUX memory readout 210.

In some implementations, with reference to FIG. 5, a conditional reset pulse can be extended until the next bit comparator decision. This is possible because the SAR set/reset logic will ensure that the BST and BR signals will be zero after writing the comparator decision to the SAR set/reset latch 306. Then, making the SR signal of the latch will not change the state of the SAR set/reset latch 306 until the next bit decision is completed. Therefore, the transfer of bit data from the ADC to the SAR set/reset latch 306 can be a low frequency operation.

FIG. 8 is a flow chart summarizing a method 800 for processing and storing image data, in accordance with some implementations of the present disclosure. Operations 802-810 of the method 800 can be performed by software, hardware, or combinations thereof, to operate the imaging system 100, according to some implementations as described above with reference to FIGS. 1-7. Operations of the method 800 can be performed in a different order, or not performed, depending on specific applications. It is noted that the method 800 may not be the only processes involved in operating the imaging system 100. Accordingly, it is understood that additional processes can be provided before, during, or after the method 800, and that some of these additional processes may be briefly described herein.

At operation block 802, the method 800 includes amplifying signals from the pixel array 102, in accordance with implementations of the present disclosure. In some implementations, the amplifiers 104 are used, as described above with reference to FIG. 1.

At operation block 804, the method 800 includes sampling and digitizing the amplified signals, in accordance with implementations of the present disclosure. In some implementations, sampling the amplified signals into an ADC capacitor can be performed by the DAC sample-and-hold module 202 with reference to FIG. 2.

At operation block 806, the method 800 includes setting a next bit, in accordance with implementations of the present disclosure. Setting the bit value can include using the comparator 204 to execute the binary search algorithm as described above with reference to FIGS. 3 and 4.

At operation block 808, the method 800 includes performing a conditional reset, in accordance with implementations of the present disclosure. The conditional reset can be implemented by the conditional reset logic 206 and stored in the SAR set/reset latch 208, as described above with reference to FIGS. 2, 3, and 5.

At operation block 810, the method 800 includes transferring the bits to the memory 108 in accordance with implementations of the present disclosure. Bits that are staged in the MUX memory readout 210 are selected and placed on the output bus, as described above with reference to FIGS. 3 and 5. Then, in an initial transfer operation, the selected bit is transferred to the intermediate memory 120 as described above with reference to FIG. 6A.

Bit-level operations 806-810 are repeated for each bit representing a portion of an image. In some implementations, the first bit to be processed is the most significant bit (MSB) as shown in FIG. 6C, and the last bit to be processed is the least significant bit (LSB), as shown in FIG. 6A.

At operation block 812, the method 800 includes performing a parallel bit transfer, in accordance with implementations of the present disclosure. In a first parallel bit transfer, bit data is transferred simultaneously from the intermediate memory 120 to the final memory 122 as described above with reference to FIG. 6B. In a subsequent parallel bit transfer, the bit data can be transferred to the register transfer logic (RTL) for further processing, as described above with reference to FIG. 6C.

As described above, HDR images that are captured at high frame rates can benefit from an efficient method of digitization and storage. When managed judiciously, such a method can be implemented without additional resources such as power, area on a chip or circuit board, or additional channels to handle high density image data. With efficient data management, the number of channels can actually be reduced, and the clock frequency governing advancement of digitized image data through a SAR ADC circuit can also be reduced, thus consuming less energy.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An apparatus, comprising:
   an amplifier configured to produce an amplified signal based on an output of a pixel array of an image sensor;
   an analog-to-digital converter (ADC) circuit configured to digitize the amplified signal as a bit stream;
   a first memory configured to serially receive the bit stream from the ADC circuit;
   a second memory configured to receive bits of the bit stream in parallel from the first memory; and
   register transfer logic configured to transfer the bits in parallel to an image processor.

2. The apparatus of claim 1, wherein the apparatus is a camera suitable for use in an automotive system.

3. The apparatus of claim 1, wherein a first control signal of the ADC circuit configured to initiate storage of a first bit is synchronized with a second control signal configured to initiate digitization of a second bit.

4. The apparatus of claim 1, wherein the ADC circuit includes a memory readout stage.

5. The apparatus of claim 4, wherein the memory readout stage is implemented as an analog multiplexer.

6. The apparatus of claim 1, wherein the ADC circuit includes:
   an ADC configured to produce a bit representing a portion of image data received from an image sensor;
   a comparator configured to produce an output based on a comparison of a bit level of the bit to a reference voltage;

conditional logic configured to generate a bit reset signal based on the output of the comparator;

a set-reset enabled latch configured to maintain or reset the bit level based on the bit reset signal; and an analog multiplexer configured to perform a serial data transfer of the bit to a memory.

7. The apparatus of claim 6, wherein the comparator includes an operational amplifier and an output latch configured to output a signal from the operational amplifier.

8. The apparatus of claim 6, wherein the comparator is configured to execute a binary search algorithm.

9. The apparatus of claim 8, wherein the binary search algorithm re-sets the bit level when the bit level is outside a reference voltage range that includes a high reference voltage and a low reference voltage.

10. The apparatus of claim 8, wherein the set-reset enabled latch is configured to perform a voltage level shift.

11. The apparatus of claim 6, wherein the conditional logic maintains the bit level when the bit level is above a low reference voltage.

12. The apparatus of claim 6, wherein the set-reset enabled latch is configured to perform a voltage level shift of the bit level between a lower voltage domain of the ADC and a higher voltage domain of the set-reset enabled latch.

13. An apparatus comprising:

an amplifier configured to produce an amplified signal based on an output of a sensor;

an analog-to-digital converter (ADC) circuit configured to digitize the amplified signal as a bit stream;

a first memory configured to serially receive the bit stream from the ADC circuit;

a second memory configured to receive bits of the bit stream in parallel from the first memory; and register transfer logic configured to transfer the bits in parallel to a processor.

14. The apparatus of claim 13, wherein the ADC circuit includes:

an ADC configured to produce a bit from the amplified signal;

a comparator configured to produce an output based on a comparison of a bit level of the bit to a reference voltage;

conditional logic configured to generate a bit reset signal based on the output of the comparator; and a set-reset enabled latch configured to maintain or reset the bit level based on the bit reset signal.

15. The apparatus of claim 14, wherein the set-reset enabled latch is configured to perform a voltage level shift of the bit level between a lower voltage domain of the ADC and a higher voltage domain of the set-reset enabled latch.

16. The apparatus of claim 14, wherein the comparator is configured to execute a binary search algorithm that re-sets the bit level when the bit level is outside a reference voltage range that includes a high reference voltage and a low reference voltage.

17. An apparatus comprising:

an analog-to-digital converter (ADC) circuit configured to generate a stream of bits by sequentially digitizing an amplified pixel signal;

a first memory configured to serially receive and store the stream of bits from the ADC circuit;

control circuitry configured to generate a first control signal for initiating storage of a current bit in the first memory, and a second control signal for initiating digitization of a next bit by the ADC circuit, wherein the control circuitry is configured to synchronize the first control signal and the second control signal to enable concurrent data transfer and digitization; and a second memory configured to receive the stream of bits in parallel from the first memory for transfer to an image processor.

18. The apparatus of claim 17, wherein the first control signal is a bus output control signal that controls a parallel transfer of bits from the first memory to the second memory; and wherein the second control signal is a latch enable signal that enables an output latch of a comparator in the ADC circuit.

19. The apparatus of claim 17, wherein the ADC circuit includes a set-reset enabled latch configured to perform a voltage level shift of the stream of bits between a first voltage domain of the ADC and a second voltage domain of the first memory.

20. The apparatus of claim 17, wherein the first memory is configured to transfer the stream of bits in parallel to the second memory only after the first memory has serially received all bits of the stream for a single pixel.

21. The apparatus of claim 17, wherein the serial transfer of the stream of bits from the ADC circuit to the first memory is performed at a frequency in a range of 130 MHz to 150 MHz.

* * * * *